(12) United States Patent
Chew

(10) Patent No.: US 10,256,219 B2
(45) Date of Patent: Apr. 9, 2019

(54) FORMING EMBEDDED CIRCUIT ELEMENTS IN SEMICONDUCTOR PACKAGE ASSEMBLES AND STRUCTURES FORMED THEREBY

(71) Applicant: Intel Corporation, Santa Clara, CA (US)

(72) Inventor: Yen Hsiang Chew, Georgetown (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/260,138

(22) Filed: Sep. 8, 2016

(65) Prior Publication Data
US 2018/0068989 A1    Mar. 8, 2018

(51) Int. Cl.
*H01L 23/02*    (2006.01)
*H01L 25/10*    (2006.01)
(Continued)

(52) U.S. Cl.
CPC .......... *H01L 25/105* (2013.01); *H01L 21/565* (2013.01); *H01L 24/73* (2013.01); *H01L 25/165* (2013.01); *H01L 25/50* (2013.01); *H01L 2224/16227* (2013.01); *H01L 2224/32225* (2013.01); *H01L 2224/73204* (2013.01); *H01L 2224/73209* (2013.01); *H01L 2224/73217* (2013.01); *H01L 2224/73259* (2013.01); *H01L 2225/1023* (2013.01); *H01L 2225/1035* (2013.01); *H01L 2225/1041* (2013.01); *H01L 2924/15311* (2013.01); *H01L 2924/19041* (2013.01); *H01L 2924/19042* (2013.01);
(Continued)

(58) Field of Classification Search
CPC ..... H01L 2225/06541; H01L 23/49827; H01L 2924/181; H01L 2224/32145; H01L 2225/1058; H01L 2224/04105; H01L 2225/06548
USPC ................................. 257/686, 777, 778, 528
See application file for complete search history.

(56) References Cited

U.S. PATENT DOCUMENTS 7,842,541 B1   11/2010  Rusli et al.
8,623,753 B1 * 1/2014  Yoshida ................ H01L 25/105
                                                           257/686
(Continued)

FOREIGN PATENT DOCUMENTS

WO        2017188951       11/2017

OTHER PUBLICATIONS

International Search Report and Written Opinion for International Patent Application No. PCT/US17/45786, dated Oct. 31, 2017.
(Continued)

*Primary Examiner* — S. V. Clark
(74) *Attorney, Agent, or Firm* — Green, Howard & Mughal LLP.

(57) ABSTRACT

Methods of forming stacked die assemblies are described. Those methods/structures may include forming a circuit element on a first substrate, wherein a first die is adjacent the circuit element, forming a via disposed directly on a surface of the circuit element, and forming a mold compound on the first die, on the circuit element and on the via, wherein the via and circuit element are completely embedded within the mold compound. A routing layer is formed on a top surface of the mold compound, and a second die is coupled with the routing layer.

16 Claims, 14 Drawing Sheets

(51) Int. Cl.
*H01L 21/56* (2006.01)
*H01L 23/00* (2006.01)
*H01L 25/16* (2006.01)
*H01L 25/00* (2006.01)

(52) U.S. Cl.
CPC ............. *H01L 2924/19043* (2013.01); *H01L 2924/19105* (2013.01)

(56) References Cited

U.S. PATENT DOCUMENTS

| | | | | |
|---|---|---|---|---|
| 8,847,372 | B1* | 9/2014 | Darveaux | ............... H01L 21/56 257/678 |
| 2010/0230806 | A1 | 9/2010 | Huang et al. | |
| 2010/0289126 | A1* | 11/2010 | Pagaila | ............ H01L 23/49822 257/659 |
| 2011/0298125 | A1 | 12/2011 | Ko | |
| 2011/0316147 | A1 | 12/2011 | Shih et al. | |
| 2012/0153445 | A1 | 6/2012 | Son et al. | |
| 2014/0021583 | A1 | 1/2014 | Lo et al. | |
| 2014/0084416 | A1 | 3/2014 | Kang | |
| 2014/0183731 | A1 | 7/2014 | Lin et al. | |
| 2014/0185264 | A1 | 7/2014 | Chen et al. | |
| 2014/0332975 | A1 | 11/2014 | Raorane et al. | |
| 2015/0382463 | A1* | 12/2015 | Kim | ................... H01L 23/49822 361/767 |
| 2016/0276239 | A1* | 9/2016 | Lin | ......................... H01L 24/19 |
| 2016/0351543 | A1* | 12/2016 | Ryu | ........................ H01L 25/04 |
| 2017/0069607 | A1* | 3/2017 | Yap | ....................... H01L 25/105 |
| 2017/0345763 | A1 | 11/2017 | Cheah et al. | |

OTHER PUBLICATIONS

International Search Report and Written Opinion for International Patent Application No. PCT/US16/29692, dated Dec. 8, 2016.

* cited by examiner

FORMING EMBEDDED CIRCUIT ELEMENTS IN SEMICONDUCTOR PACKAGE ASSEMBLES AND STRUCTURES FORMED THEREBY

BACKGROUND OF THE INVENTION

As electronic devices become smaller, reducing the footprint of these devices becomes important. One approach to reducing device footprints includes stacking multiple electronic packages in a package-on-package arrangement.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
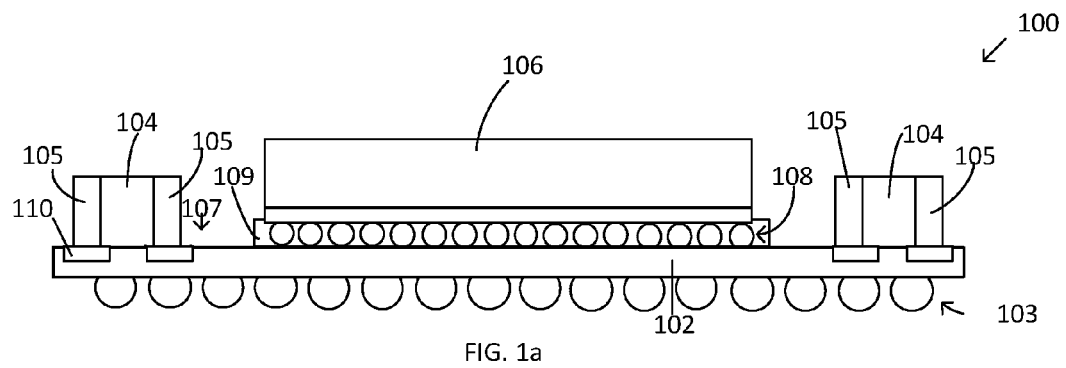
FIGS. 1a-1o represent cross-sectional views of structures according to embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments.

The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views. The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers. Layers and/or structures "adjacent" to one another may or may not have intervening structures/layers between them. A layer(s)/structure(s) that is/are directly on/directly in contact with another layer(s)/structure(s) may have no intervening layer(s)/structure(s) between them.

Various implementations of the embodiments herein may be formed or carried out on a substrate, such as a package substrate. A package substrate may comprise any suitable type of substrate capable of providing electrical communications between a die, such as an integrated circuit (IC) die, and a next-level component to which an IC package may be coupled (e.g., a circuit board). In another embodiment, the substrate may comprise any suitable type of substrate capable of providing electrical communication between an IC die and an upper IC package coupled with a lower IC/die package, and in a further embodiment a substrate may comprise any suitable type of substrate capable of providing electrical communication between an upper IC package and a next-level component to which an IC package is coupled.

A substrate may also provide structural support for a die. By way of example, in one embodiment, a substrate may comprise a multi-layer substrate—including alternating layers of a dielectric material and metal—built-up around a core layer (either a dielectric or a metal core). In another embodiment, a substrate may comprise a coreless multi-layer substrate. Other types of substrates and substrate materials may also find use with the disclosed embodiments (e.g., ceramics, sapphire, glass, etc.). Further, according to one embodiment, a substrate may comprise alternating layers of dielectric material and metal that are built-up over a die itself—this process is sometimes referred to as a "bumpless build-up process." Where such an approach is utilized, conductive interconnects may or may not be needed (as the build-up layers may be disposed directly over a die, in some cases).

Embodiments of methods of forming packaging structures, such as methods of forming package on package/stacked die structures, are described. Those methods/structures may include providing at least one circuit element disposed on a first substrate, wherein a first die is on the first substrate, and wherein the first die is adjacent the at least one circuit element. An embedded via may be disposed directly on a surface of the circuit element, and a mold compound may be on the first die, on the circuit element and on the embedded via. The embedded via may be completely embedded in the mold compound. A routing layer may be disposed on a top surface of the mold compound, and a second die may be disposed on the routing layer. The embodiments herein enable customizable top side package interconnects, wherein circuit elements embedded in the mold compound of a lower die can be electrically coupled to a top package module with routing layer(s) that may be formed on a top side of the mold compound.

Figure 1B:
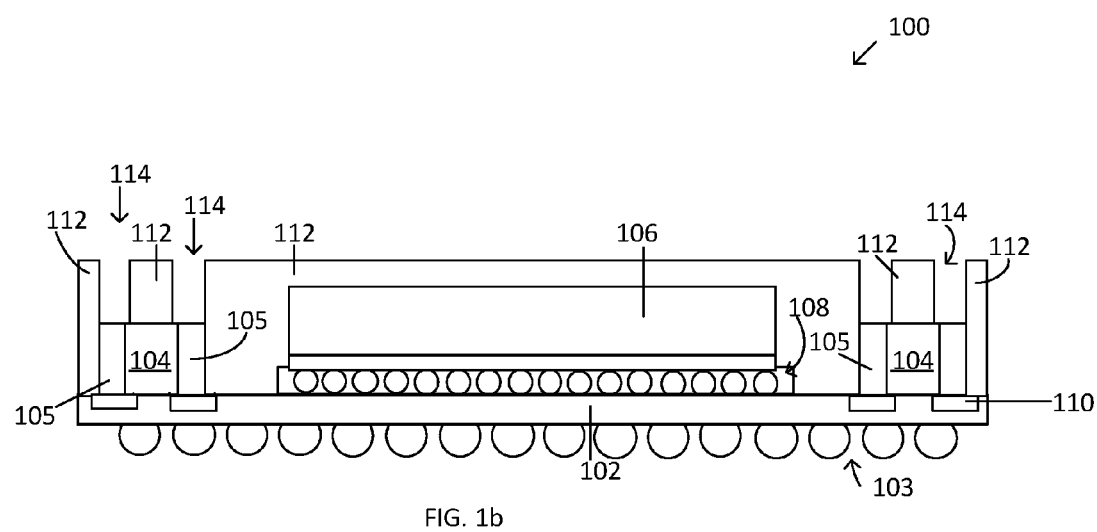
FIG. 1p represents a top view of a structure according to embodiments.
Figure 1C:
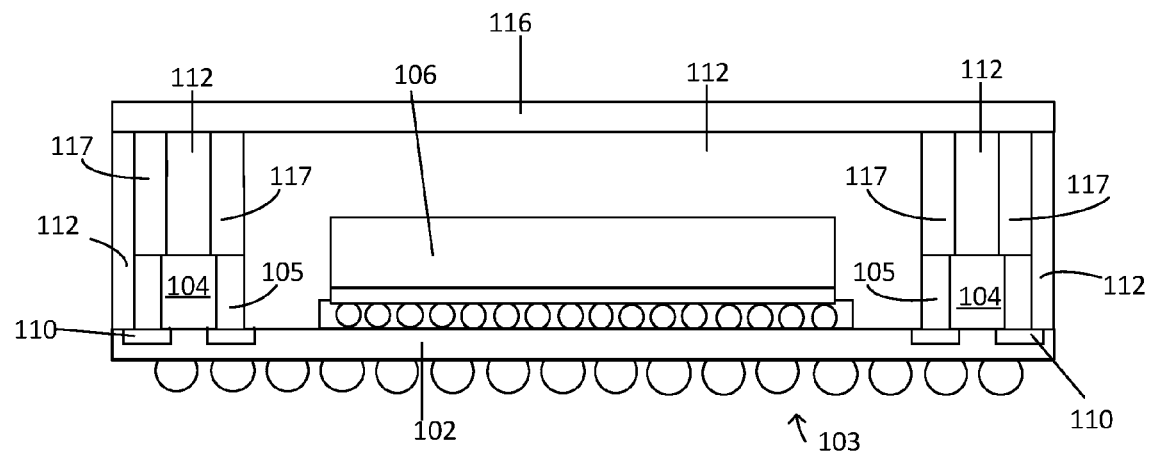
Figure 1D:
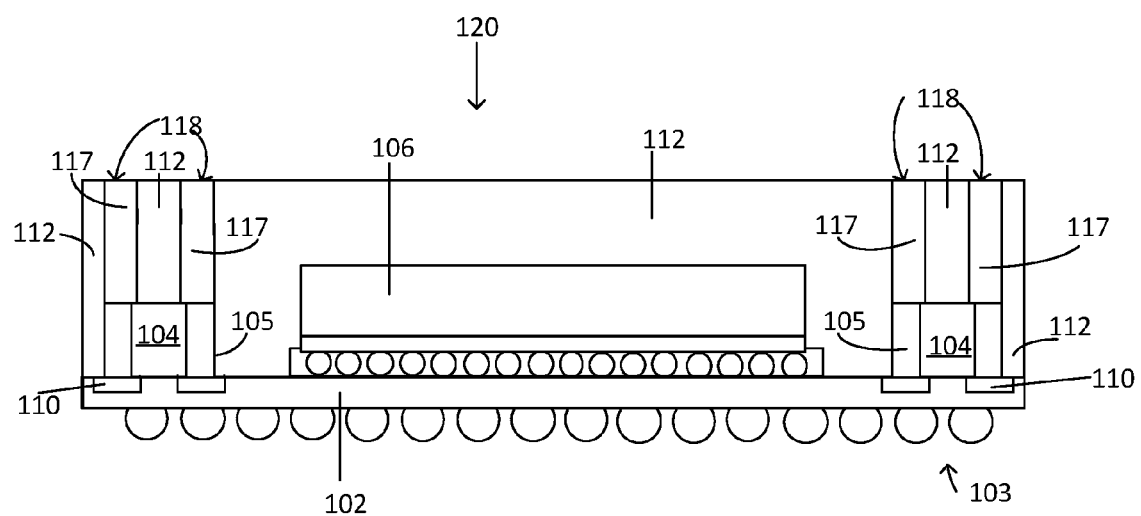
Figure 1E:
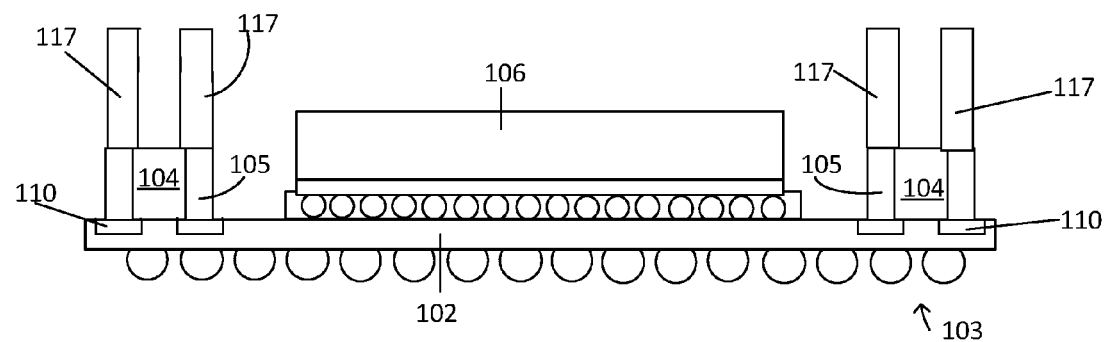
Figure 1F:
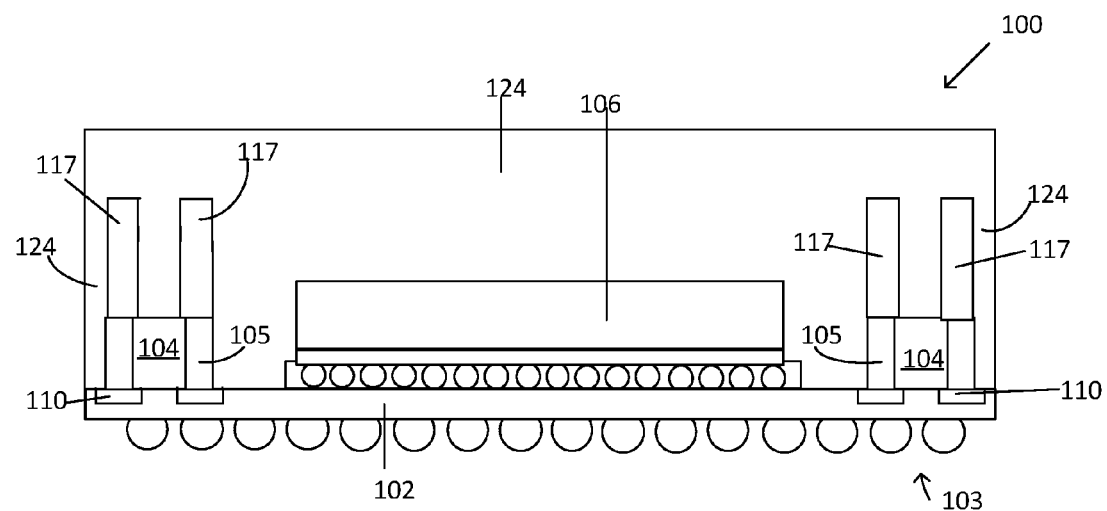
Figure 1G:
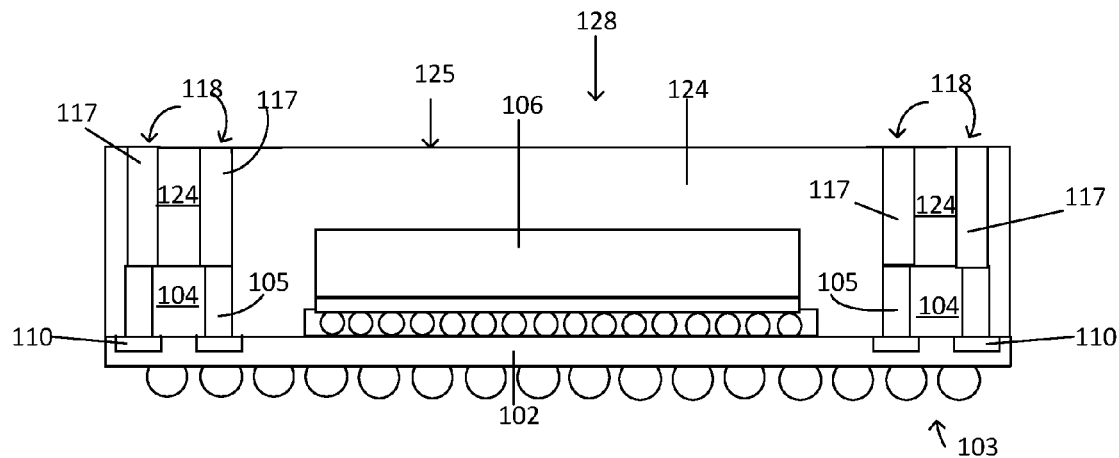
Figure 1H:
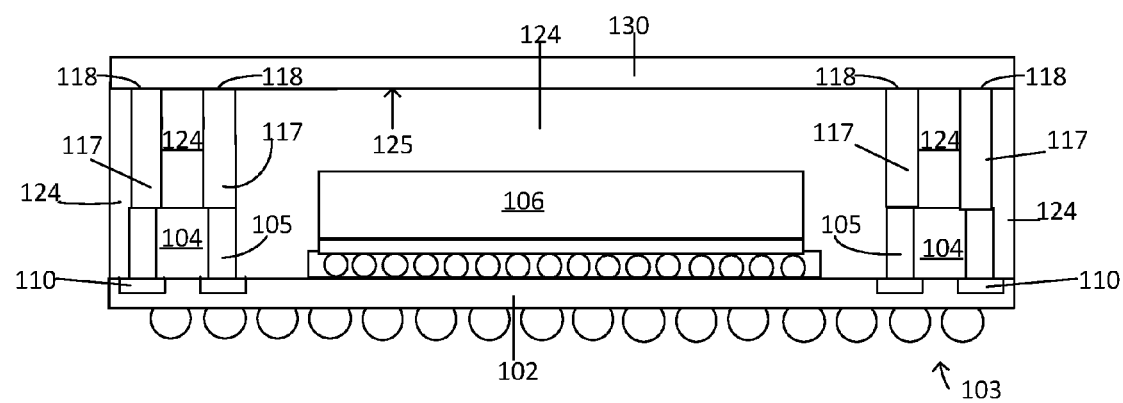
Figure 1I:
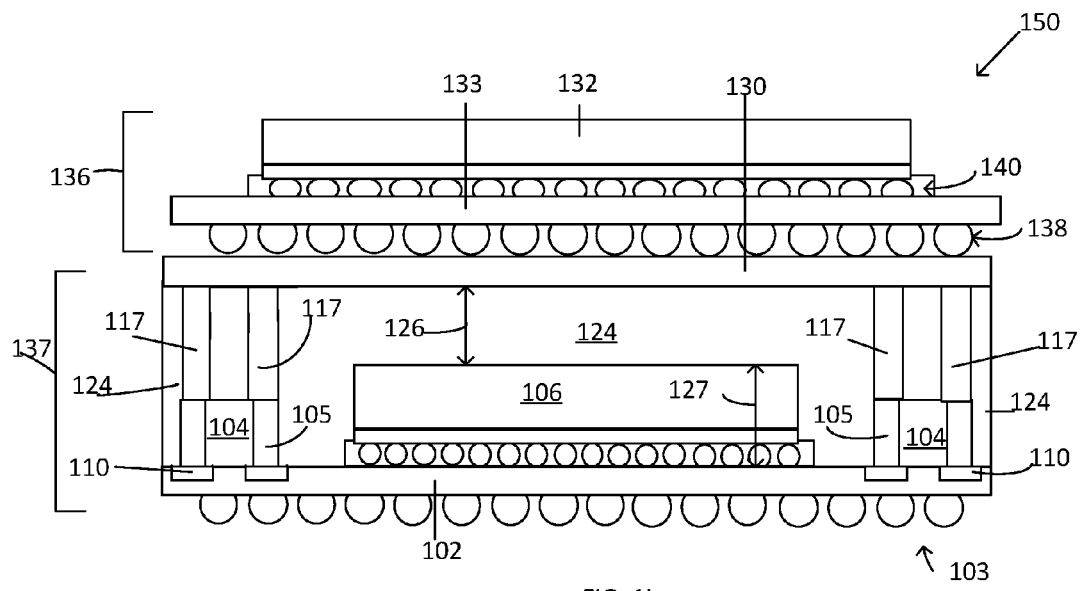
Figure 1J:
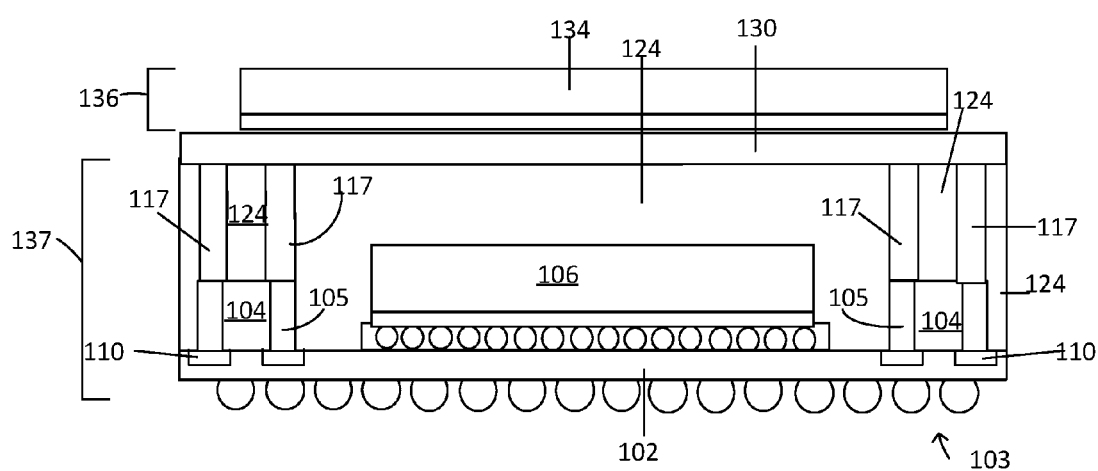
Figure 1K:
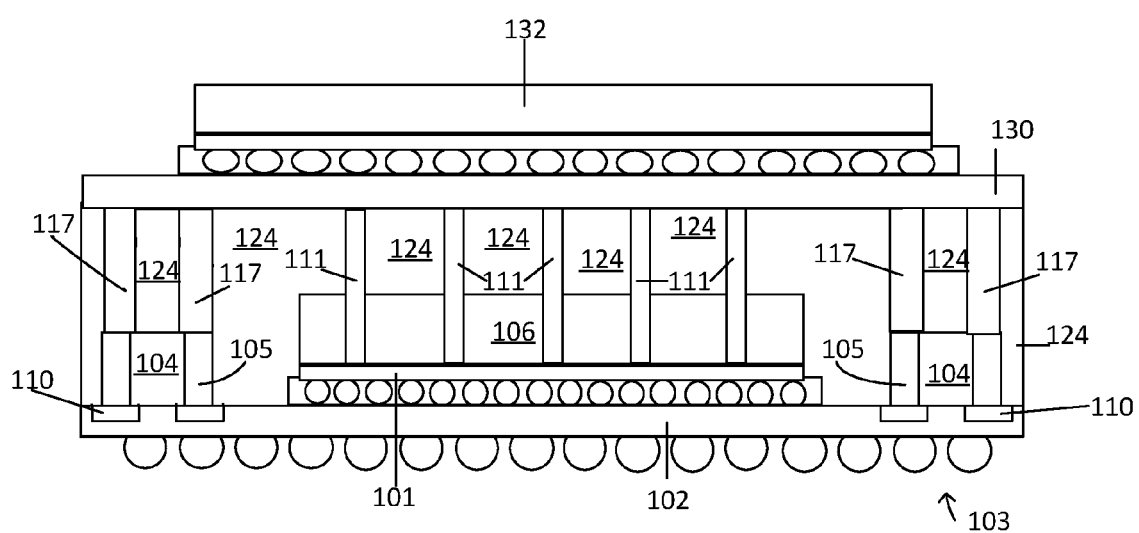
Figure 1L:
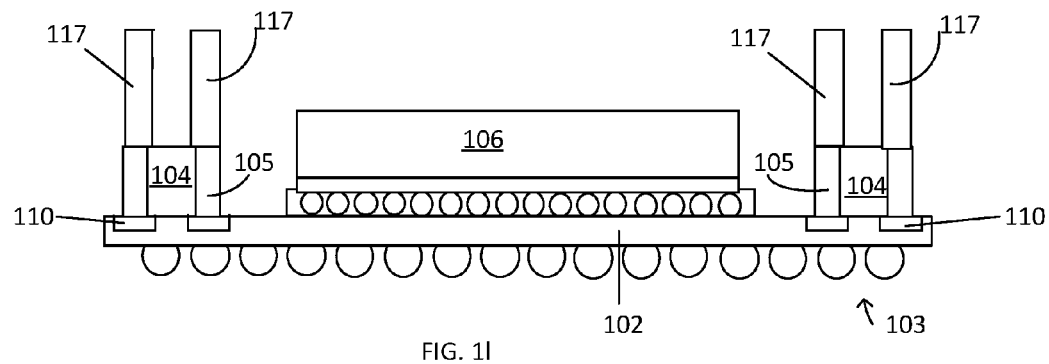
Figure 1M:
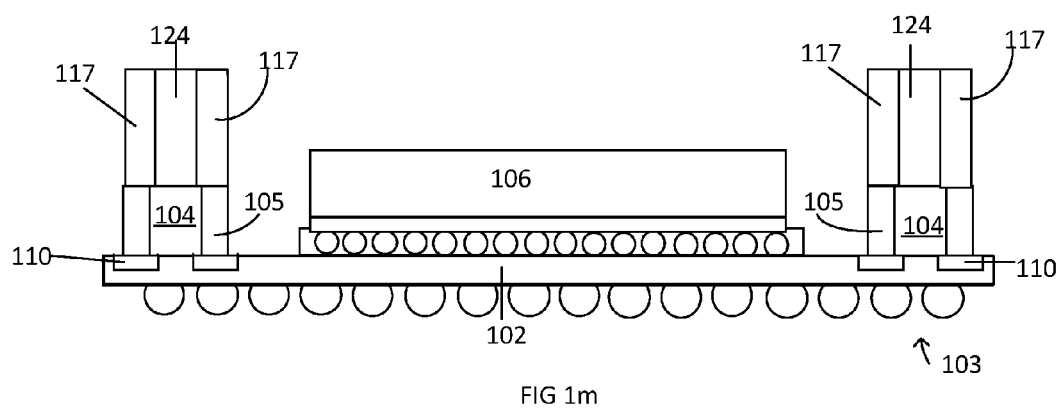
Figure 1N:
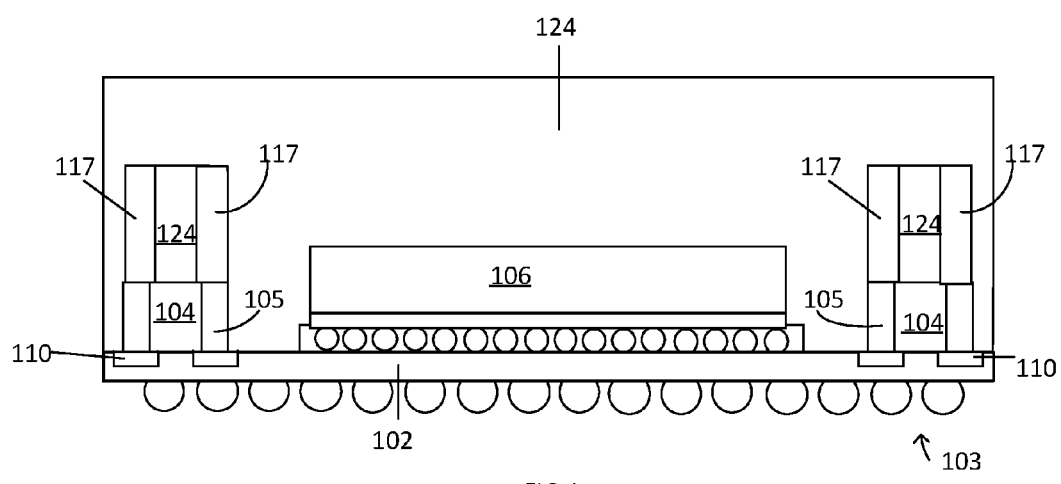
Figure 1O:
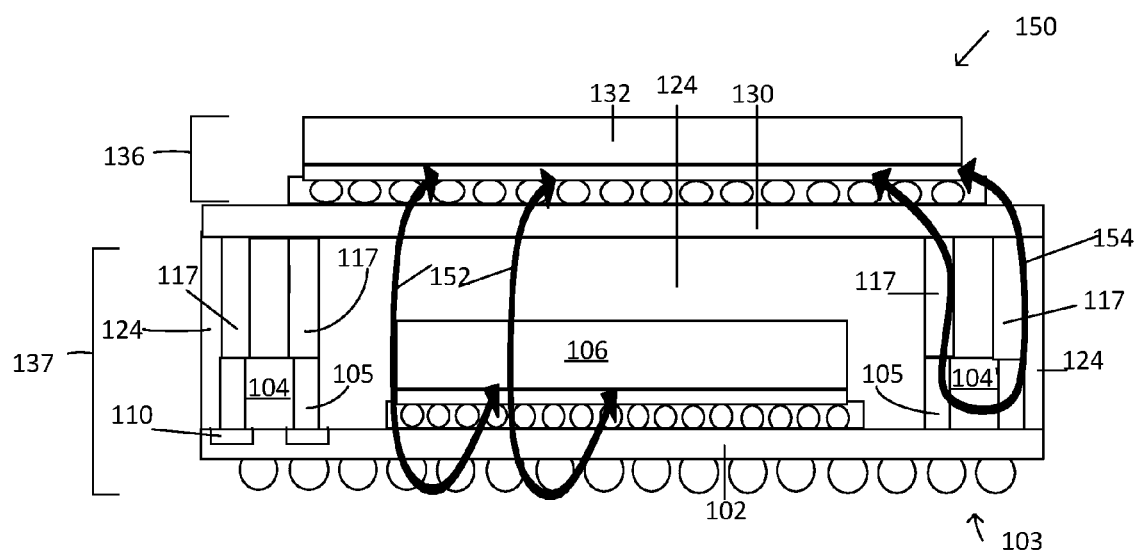

FIGS. 1a-1o illustrate side cross-sectional views of embodiments of fabricating stacked die package structures, such as package on package (PoP) structures in microelectronic devices/packages. In FIG. 1a (cross-sectional view), a portion of package structure 100, which may comprise a portion of a (PoP) package, for example. The package structure 100, which may comprise a microelectronic package structure in an embodiment, may comprise a substrate 102, which may comprise a first substrate 102 in an embodiment, and may comprise any suitable substrate materials, such as but not limited to dielectric materials, for example. In an embodiment, conductive interconnect structures 103, may be disposed on a bottom surface of the substrate 102. The conductive interconnect structures 103 may comprise solder balls for example, and may comprise conductive materials such as a copper material 103. The conductive interconnect structures 103 may comprise conductive structures which may serve to couple the first substrate 102 with another substrate, such as a motherboard, for example.

In an embodiment, at least one circuit element 104 may be disposed on a top surface 107 of the substrate 102, and may be directly disposed and electrically coupled with conductive structures 110, which may be disposed within/on the substrate 102. In other cases, the at least one circuit component/element 104 may not be electrically coupled with the first substrate 102. The at least one circuit element 104 may comprise such circuit elements as a resistor, a capacitor, and an inductor, for example, but could comprise any type of suitable circuit elements according to the particular application. In an embodiment, the circuit elements 104 may further comprise a conductive material 105, for example, on a surface of the circuit element 104, which may comprise contact structures, for example. In an embodiment, the circuit elements 104 may be electrically coupled with the substrate 102 via the conductive structures 110. The circuit elements 104 may be placed/attached to the substrate 102 using any suitable attachment processes.

In an embodiment, a device/die 106 may be placed/may be disposed on the substrate 102 adjacent to the at least one circuit component 104. In an embodiment, the device/die 106 may be coupled with the substrate 102 by the use of a plurality of conductive structures 108. In an embodiment, the plurality of conductive structures 108 may comprise a ball grid array comprising solder materials, for example. In an embodiment, an underfill material 109, such an epoxy material, for example, may be located between the conductive structures 108 and may be on the top surface 107 of the substrate 102. In other embodiments the underfill 109 may not be present on the substrate 102 surface 107. The die/device 106 may comprise any type of device suitable for a particular application, such as but not limited to a microprocessor, a graphics processor, a signal processor, a network processor, a chipset, etc. In one embodiment, the die 106 comprises a system-on-chip (SoC) having multiple functional units (e.g., one or more processing units, one or more graphics units, one or more communications units, one or more signal processing units, one or more security units, etc.). However, it should be understood that the disclosed embodiments are not limited to any particular type or class of die/devices. An active side (which may comprise various circuit components such as transistors, for example) of the die 106 may be electrically and physically coupled with the substrate 102 by the solder balls/conductive structures 108.

The conductive structures 108 may comprise any type of structure and materials capable of providing electrical communication between the die/device 106 and substrate 102. In the embodiment, each of the interconnects 108 comprises an electrically conductive terminal on the die (e.g., a pad, bump, stud bump, column, pillar, or other suitable structure or combination of structures) and a corresponding electrically conductive terminal on the substrate 102 (e.g., a pad, bump, stud bump, column, pillar, or other suitable structure or combination of structures). Solder (e.g., in the form of balls or bumps) may be disposed on the terminals of the substrate and/or die, and these terminals may then be joined using a solder reflow process. Of course, it should be understood that many other types of interconnects and materials are possible (e.g., wirebonds extending between the die 106 and substrate 102).

The terminals on die 106 may comprise any suitable material or any suitable combination of materials, whether disposed in multiple layers or combined to form one or more alloys and/or one or more intermetallic compounds. For example, the terminals on die 106 may include copper, aluminum, gold, silver, nickel, titanium, tungsten, as well as any combination of these and/or other metals. In other embodiments, a terminal may comprise one or more non-metallic materials (e.g., a conductive polymer). The terminals on substrate 102 may also comprise any suitable material or any suitable combination of materials, whether disposed in multiple layers or combined to form one or more alloys and/or one or more intermetallic compounds. For example, the terminals on substrate 102 may include copper, aluminum, gold, silver, nickel, titanium, tungsten, as well as any combination of these and/or other metals. Any suitable solder material may be used to join the mating terminals of the die 106 and substrate 102, respectively. For example, the solder material may comprise any one or more of tin, copper, silver, gold, lead, nickel, indium, as well as any combination of these and/or other metals. The solder may also include one or more additives and/or filler materials to alter a characteristic of the solder (e.g., to alter the reflow temperature).

In an embodiment, a patterning material 112, such as a resist material for example, may be formed on the die 106 and on the circuit elements 104 (FIG. 1b). The resist 112 may be patterned to form openings 114 that are adjacent to the circuit elements 104, in an embodiment. In an embodiment, a conductive material may be formed within the openings (FIG. 1c) to form conductive vias 117 in the openings 114. The conductive material may comprise any suitable conductive material, such as copper, for example, and may be formed using any suitable process, such as a plating process, for example. In an embodiment, a portion 116 of the conductive material that may be disposed on a top surface of the resist material 112 may be removed (using a removal process 120, such as an etch process, for example) to expose a top surface 118 of the conductive vias 117 (FIG. 1d). In an embodiment, the conductive material 116 may comprise copper, for example, and a grinding process 120 may be utilized to remove the portion 116 of the conductive material to expose the surface 118 of the metal vias 117.

In an embodiment, the resist material 112 may be removed from the package structure 100 to further expose the vias 117 (FIG. 1e). In an embodiment, the vias 117 may be directly disposed on a surface of the conductive elements 104, and may also be directly disposed on the top surface of the substrate 102. In other embodiments, the vias 117 may be disposed directly on contact structures, such as contact structures 105, adjacent the at least one circuit element 104. For example, the via 117 may or may not extend fully to the top surface of the substrate 102, depending upon the particular application. Although the conductive vias 117 illustrated in FIG. 1e are shown as having substantially parallel sidewalls, the conductive vias 117 may have any profile, according to the particular design requirements. For example, any of the vias 117 may be tapered.

A mold compound 124 may be formed on the vias 117, on the die/device 106, and on the circuit elements 104, and may be directly disposed on the die, circuit elements and vias, 106, 104, 117 (FIG. f). In an embodiment, the mold material 124 may completely and/or substantially completely embed the patterned conductive material/vias, such that the vias 117 may comprise embedded vias 117. The circuit elements 104 and optionally the die 106 may likewise be substantially/completely embedded within the mold compound 124, in some embodiments. In an embodiment, there may be two vias 117 associated with each of the circuit elements 104, and in other embodiments there may be less or more than two vias associated with each of the at least one circuit elements 104. The mold compound 124 may be formed of any suitable material, such as a polymer compound, a poly-resin mold compound, an elastomer mold compound, or any other suitable material. In an embodiment, the mold material/compound 124 may be directly disposed on at least a portion of the first die 106 and may be directly disposed on at least a portion the at least one circuit element 104.

Other examples of mold compounds that may be included in the mold compound 124 may include plastic materials, thermosetting polymers, silicon composites, glass, epoxy resins, or fiberglass epoxy resins. The mold compound 124 may also include some filler material. For example, the mold compound 124 may include an epoxy resin with tiny grains (e.g., on the order of a micrometer) of fused silica or amorphous silicon dioxide. In some embodiments, the mold compound 124 may be a flexible material (e.g., to enable some wearable device applications). In some embodiments, the mold compound 124 may be a heat conductive (but electrically insulative) material that may allow the mold compound 124 to function as a heat spreader and spread heat generated by the die 106 to other areas of the structure 100 (or a larger package or assembly in which the structure 100 is included). In another embodiment, the mold compound 124 may be formed initially on the circuit components 104, between the vias 117 (FIGS. 1*l*-1*n*), to provide mechanical support for the circuit components 104, prior to forming the mold compound 124 on the rest of the substrate 102.

A portion of the molding compound 124 may be removed using a removal process 128 (FIG. 1*g*), to expose a top portion 118 of the embedded vias 117. In an embodiment, a top surface 125 of the mold compound and the top surface 118 of the embedded vias 117 may be coplanar. A routing layer/material 130 may be formed on the top surfaces 118 of the embedded vias 117 and on the top surface of the mold compound 124 (FIG. 1*h*). In an embodiment, the routing layer 130 may be disposed/formed on the entire top surface 125 of the molding compound 124. In another embodiment, the routing layer 130 may only be disposed on a portion of the top surface 125 of the molding compound 124. The routing layer 130 may comprise a conductive material, such as a metal, and may comprise copper, for example.

The routing layer 130 may further comprise conductive pads, for input/output (I/O) routing for example, that may be electrically and/or physically in contact with a surface, such as the top surface 118, of the embedded vias 117. The embedded vias 117 may be directly disposed on the routing layer 130, and may be directly disposed on the conductive components 110 of the substrate 102, in an embodiment. In other embodiments, the embedded vias 117 may be directly coupled and in physical contact with the routing layer 130 may be electrically coupled with the conductive components 110, and may be directly disposed on the conductive material 105 of the circuit elements 104, and may not be physically in contact with the substrate 102.

A second die/device 132, may be placed/attached on the routing layer 130 (FIG. 1*i*) to form a package on package (PoP)/stacked die structure 150. The second die/device 132 may be disposed on a substrate 133, such as a second substrate 133, and may be coupled to the substrate 133 with a first plurality of bumps/conductive structures 140, and a second set of bumps/conductive structures 138 may couple the substrate 133 to the routing layer 130, in an embodiment. The second die/device 132 may comprise such devices as a packaged die, a display, a sensor, a memory device, any other input or output device, any other processing or storage device, or any combination of such devices. such as a packaged die, a display, a sensor, a memory device, any other input or output device, any other processing or storage device, or any combination of such devices.

In an embodiment, the PoP structure/assembly 150 may comprise a top/upper package module/IC package 136 (comprising the second die/device 132 on the second substrate 133, in an embodiment) stacked/disposed on a bottom/lower package module/IC package 137 (wherein the bottom package module 137 may comprise the first die/device 106 on the first substrate 102, in an embodiment). Each of the lower and upper IC packages 137, 136 may include any suitable device or combination of devices. According to one embodiment, lower IC package 137 includes one or more processing systems and upper IC package 136 includes one or more memory devices. In another embodiment, lower IC package 137 includes one or more processing systems and upper IC package 136 comprises a wireless communications system (or, alternatively, includes one or more components of a communications system). In a further embodiment, lower IC package 137 includes one or more processing systems and upper IC package 136 includes a graphics processing system. The PoP assembly 150 may comprise part of any type of computing system, such as a hand-held computing system (e.g., a cell phone, smart phone, music player, etc.), mobile computing system (e.g., a laptop, net-top, tablet, etc.), a desktop computing system, or a server. In one embodiment, the PoP assembly 150 comprises a solid state drive (SSD).

In an embodiment, the PoP package structure/assembly may comprise a molded semiconductor package assembly with circuit elements 104 such as die side capacitors, resistors and inductors, wherein external interconnects/pads can be placed anywhere on the routing layer 130. In an embodiment, the embedded vias 117 may extend a distance 126 above a Z height 127 of the bottom package module 137. Mold encapsulated embedded vias 117 on the bottom package module may function as electrical interconnects between the metal routing and metal pads on the routing layer 130 and the mold encapsulated circuit components 104.

In another embodiment, the second device may comprise a second device 134 (FIG. 1*j*), wherein the second device 134 may be formed on the routing layer 130 by using a surface activated bonding process, wherein the second device/die 134 may be bonded to the routing layer 130, and may not comprise a substrate for attaching/coupling the second module 136 comprising the second die 134 on the first module 137. In an embodiment, the second die 134 may comprise a wearable display that may be, for example, coupled to the routing layer 130 by surface activated bonding.

Figure 1P:
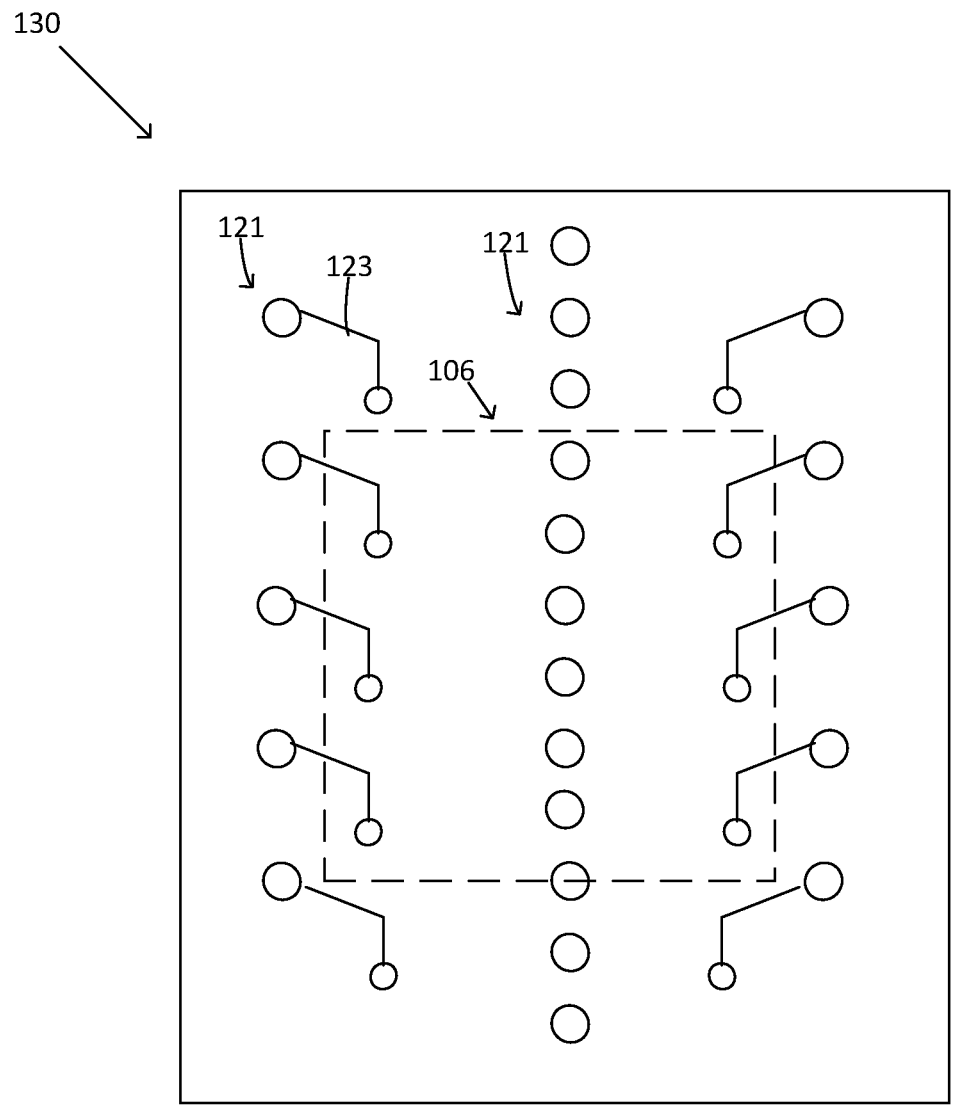

In some embodiments, power and ground pads of the PoP assembly 150 may be routed to match the locations of the power and ground pads of the second die 132,133 for example. Such an arrangement may not be achievable by conventional approaches, in which conductive pad placement may be confined to areas outside a footprint of the die 106 (see FIG. 1*p*, top view of routing layer). In an embodiment, the spacing, size, and shape of each contact pad 121 may be adjusted based on solder ball pitch requirements of the second die 132, 133. For example, the contact pads 121 may support a large enough solder ball pitch to enable a preassembled memory package module to be used as the device 132/133. Such an arrangement may not be achievable using conventional approaches that may be limited to using micro bumps to connect top and bottom dies, in some cases. In another embodiment, the second device may comprise a radio chip. In such embodiments, the size, traces 123, placement, and pitch of the contact pads 121 of the routing layer 130 may be designed to match the impedance of the radio chip in order to achieve improved performance relative to a conventional approach in which the layout, trace length, and trace width of the contact pads 121 and the traces 123 may not be as flexible to achieve the matched impedance.

In another embodiment, multiple electronic components/devices may be coupled to the routing layer 130. For example, multiple numbers of devices may be coupled to the routing layer 130. Different contact pad pitches of various devices may be accommodated by the ability of the routing layer 130 to be patterned with contact pads 121 and traces 123 in any desired arrangement, including arranging contact pads 121 inside or outside the footprint of the die 106. This customization enables the PoP package assembles of the embodiments herein to stack multiple electronic devices having different pitches, enables significant design flexibility.

Referring back to FIG. 1k, the PoP module of the embodiments herein may further include through silicon vias (TSV's) 111 embedded in the mold compound 124 and directly coupled with the routing layer 130. The through silicon vias 111 may comprise conductive material, and may extend through the backside of the die 106, and may be in contact with an active area 101 of the first die 106. In some embodiments, the through silicon vias 111 may be included in the package assembly to further increase the number of I/O interconnects between top and bottom package modules. FIG. 1o depicts an embodiment wherein circuit elements 104 may be routed such that they may be shared and/or inserted between an I/O of the top module 136 and I/O of the bottom module 137, such as by utilizing routing traces 152, for example, between the top and bottom modules 136, 137 of the package assembly 150. In another embodiment, a circuit element 104' may be routed only to the top module 137, by utilizing routing traces such as 154, for example.

Figure 2A:
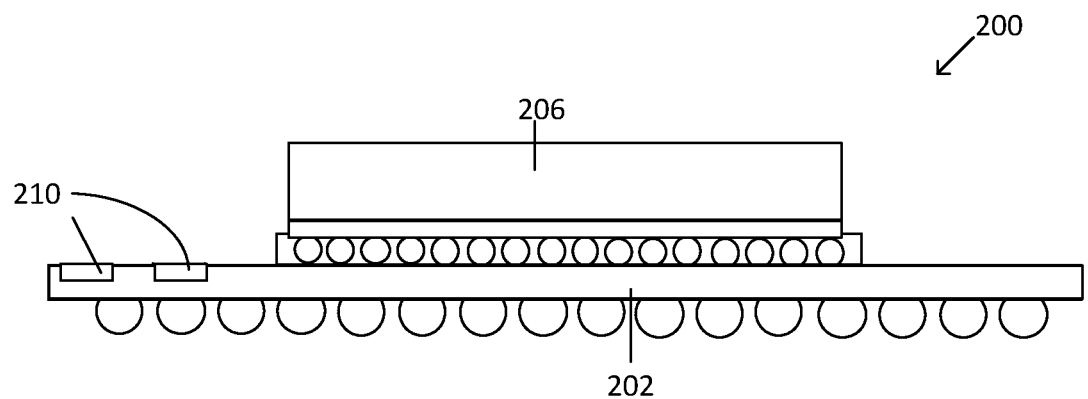
FIGS. 2a-2b represent cross-sectional and top views of structures according to embodiments.
Figure 2A:
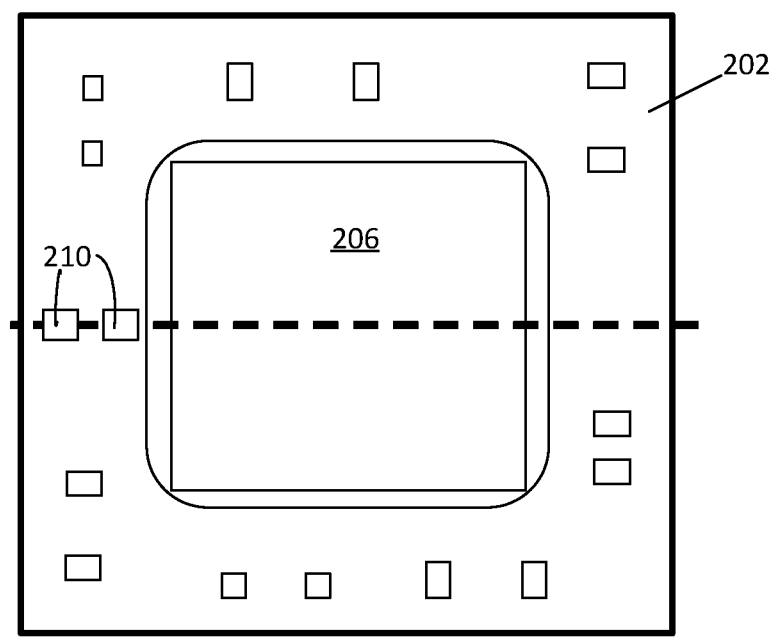
Figure 2B:
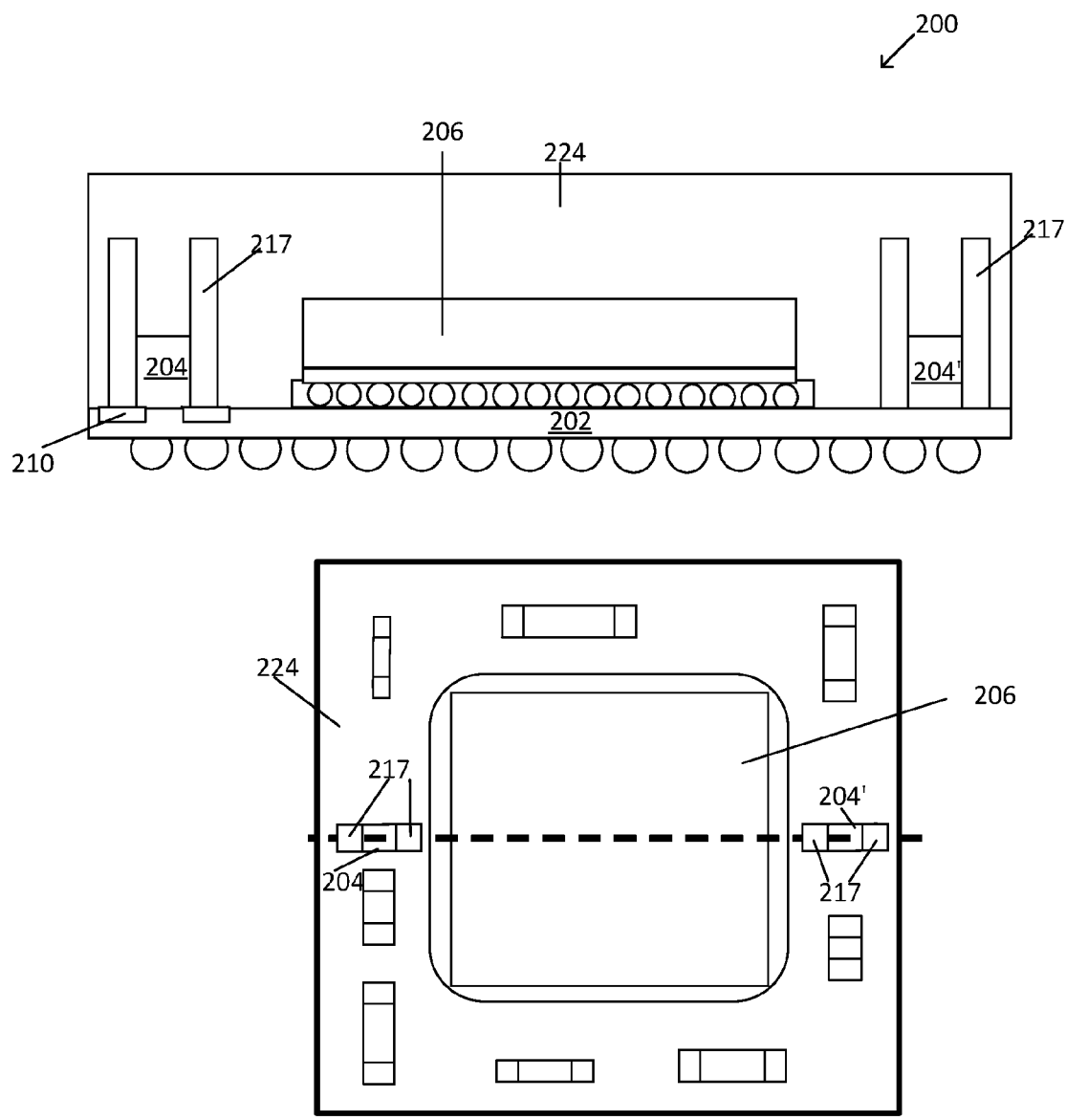

FIGS. 2a-2b depict cross sectional and top views of a portion of a package assembly 200 including conductive pads 210 on a first substrate 200 adjacent and outside the footprint of a die 206 (FIG. 2a). In an embodiment, one of the circuit elements 204 is coupled to the conductive pads 210 on the first substrate 202, and another circuit element 204' is not coupled to conductive pads/structures 210 on the first substrate 202 (FIG. 2b). Embedded vias 217 are coupled to the circuit elements 204, 204', and are embedded in a mold compound 224. Circuit elements 204, 204' are likewise embedded in the mold compound 224.

The various embodiments of the package assemblies/structures described herein remove the need to use an interposer with embedded circuit elements. In some embodiments, a common circuit component may be shared between the bottom and top module. Embodiments herein enable electrically connecting circuit components to a top module of a PoP package assembly by embedding circuit components in the mold of a bottom package assembly, wherein the mold covers the bottom module and provides electrical pathways from the embedded circuit components to the top module.

The embodiments herein enable the entire area of a top package assembly/module to be used for external pad placement, which increases the total number of pads or external interconnects that can be placed on top of a package assembly. The embodiments enable the impedance, location, size and shape of the external pads on the routing layer to be customized based on the impedance, location size shape and pitch requirements of a top stacked package module or die. For example, circuit elements embedded in the mold compound of a bottom module may be clamp capacitors for power and ground pads of the top module. Terminals of the clamp capacitors may be routed to match the location and pitch of the power and ground pads of the top module for easy stacking.

In another example, connecting/coupling a radio or a RF chip on a bottom package assembly may require the impedance of the bottom module to be customized to match the impedance of the radio or RF chip for optimum performance. The embodiments herein enable circuit components to be inserted between an I/O pin of a top module and an I/O of a bottom module for better impedance matching, without having to embed the circuit components on an interposer or an intermediate substrate. Additionally, interposer embedded components may not be usable across different package assemblies due to differences in component requirements, such as impedance requirements of top modules, z height, etc. In contrast, the Z-heights of mold embedded vias, as well as the impedance values of embedded circuit components, are easily adjustable through the package molding and thinning processes described herein. Thus, a common process may be used to fabricate mold encapsulated circuit components across all package assembly, irrespective of the bottom package circuit components impedance values, die or stacked die z height thickness and solder ball pitch requirements, in some cases.

Since there is much flexibility with the location of the routing layer on the top surface of the mold compound, in some embodiments metal pads can cover the entire top area of the mold compound. Hence terminals of a circuit component can be routed to any location on the routing layer. The embodiments herein increase the number of circuit components that may fit into a PoP/stacked assembly, which increases effective impedance of such package assemblies. Higher effective impedance increases the effectiveness of package assemblies to support dies with higher impedance requirements (for example, in the case of top modules that may require large or many clamp capacitors for power and ground pins, or in embodiments employing a top module with many I/O pins that require a termination resistor, capacitor or inductor). The package assembly embodiments herein are applicable for system on chip (SOC), multi-chip package assembly, and wearable package assemblies, such as chip sets including radio, sensor, and display devices, for example.

Figure 3:
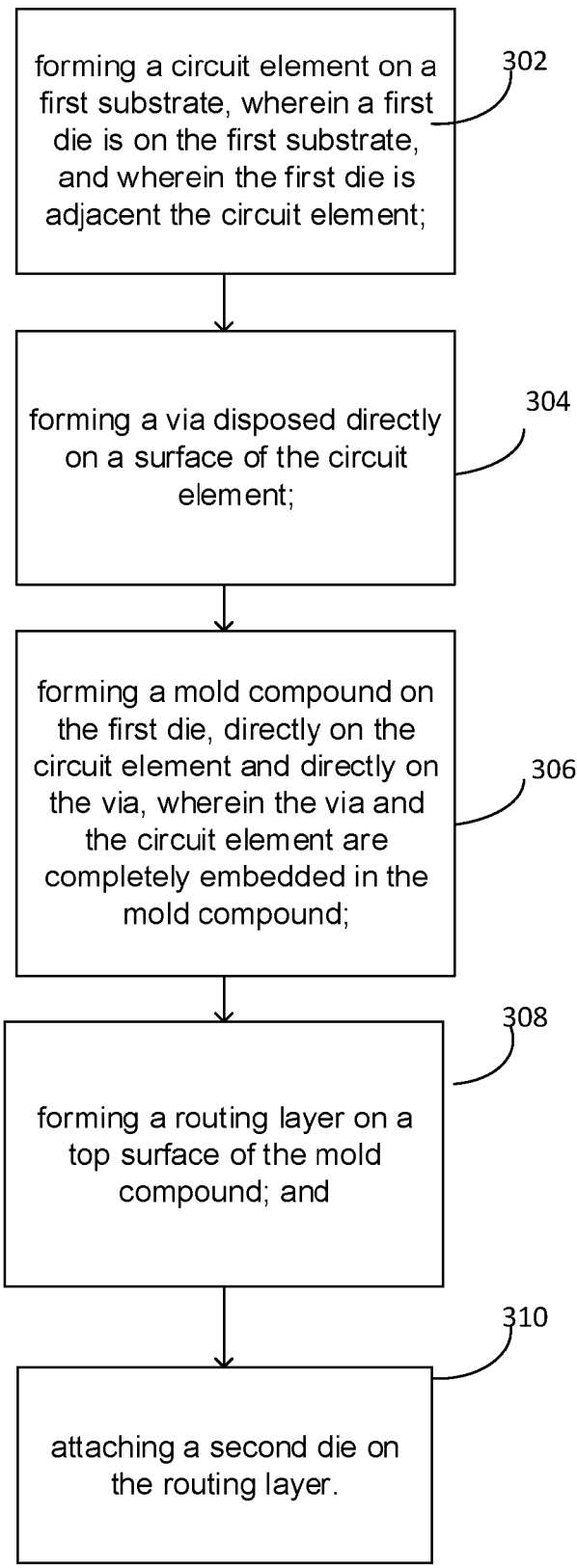
FIG. 3 represents a flow chart of a method according to embodiments.

FIG. 3 depicts a method according to embodiments herein. At step 302, a circuit element may be formed on a first substrate, wherein a first die is on the first substrate, and wherein the first die is adjacent the circuit element. At step 304, a via may be formed that is disposed directly on a surface of the circuit element. At step 306, a mold compound may be formed on the first die, directly on the circuit element and directly on the via, wherein the via, the die and the circuit component are completely embedded in the mold compound, in an embodiment. The circuit component is not disposed within an interposer. At step 308, a routing layer may be formed on a top surface of the mold compound. At step 310, a second module or die may be attached on the routing layer. The package assembly may comprise a PoP/stacked die assembly, in an embodiment.

The structures of the embodiments herein may be coupled with any suitable type of structures capable of providing electrical communications between a microelectronic device, such as a die, disposed in package structures, and a next-level component to which the package structures may be coupled (e.g., a circuit board). The device/package structures, and the components thereof, of the embodiments herein may comprise circuitry elements such as logic circuitry for use in a processor die, for example. Metallization layers and insulating material may be included in the structures herein, as well as conductive contacts/bumps that may couple metal layers/interconnects to external devices/layers. In some embodiments the structures may further comprise a plurality of dies, which may be stacked upon one another, depending upon the particular embodiment. In an embodiment, the die(s) may be partially or fully embedded in a package structure.

The various embodiments of the device structures included herein may be used for system on a chip (SOC) products, and may find application in such devices as smart phones, notebooks, tablets, wearable devices and other electronic mobile devices. In various implementations, the package structures may be included in a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder, and wearable devices. In further implementations, the package devices herein may be included in any other electronic devices that process data.

Figure 4:
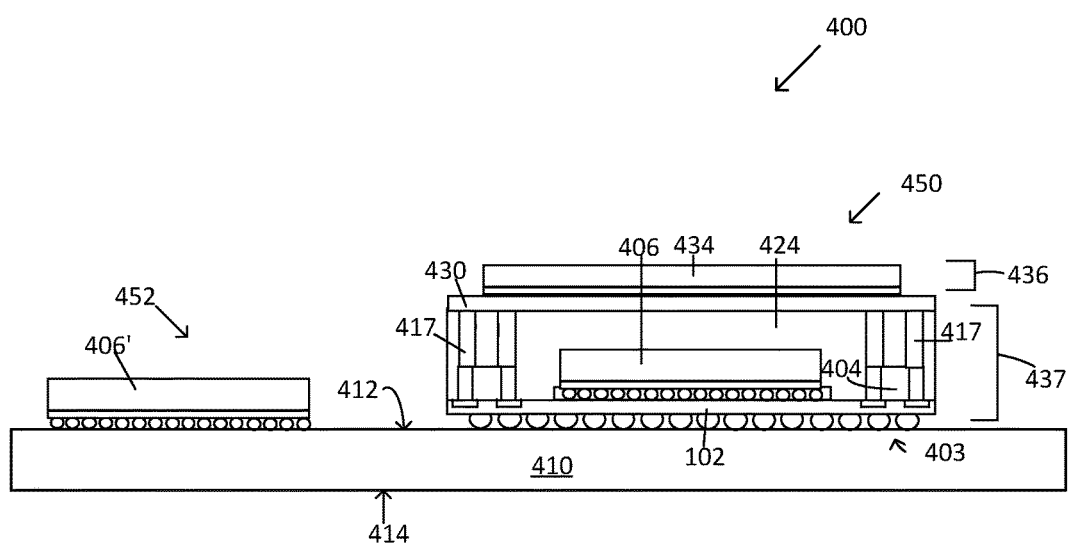
FIG. 4 represents a computer system implementing one or more embodiments.

Turning now to FIG. 4, illustrated is an embodiment of a computing system 400. The system 400 includes a number of components disposed on a mainboard 410 or other circuit board. Mainboard 410 includes a first side 412 and an opposing second side 414, and various components may be disposed on either one or both of the first and second sides 412, 414. In the illustrated embodiment, the computing system 400 includes a stacked/PoP die assembly 450, (similar to the stacked/PoP die assembly of FIG. 1i, for example) disposed on the mainboard's 410 first side 412. The stacked/PoP die assembly 450 may comprise any of the embodiments described herein, such as vias 417 and circuit components 404 that are embedded within a mold compound 424 of a bottom module 437, with a top module 436 coupled to a routing layer 430 disposed between the top and bottom modules 436, 437. System 400 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desktop computers and servers.

Mainboard 410 may comprise any suitable type of circuit board or other substrate capable of providing electrical communication between one or more of the various components disposed on the board. In an embodiment, a second die assembly 452, which may include die 406', may be disposed on the mainboard 410. In one embodiment, for example, the mainboard 410 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 410. However, it should be understood that the disclosed embodiments are not limited to the above-described PCB and, further, that mainboard 410 may comprise any other suitable substrate.

Figure 5:
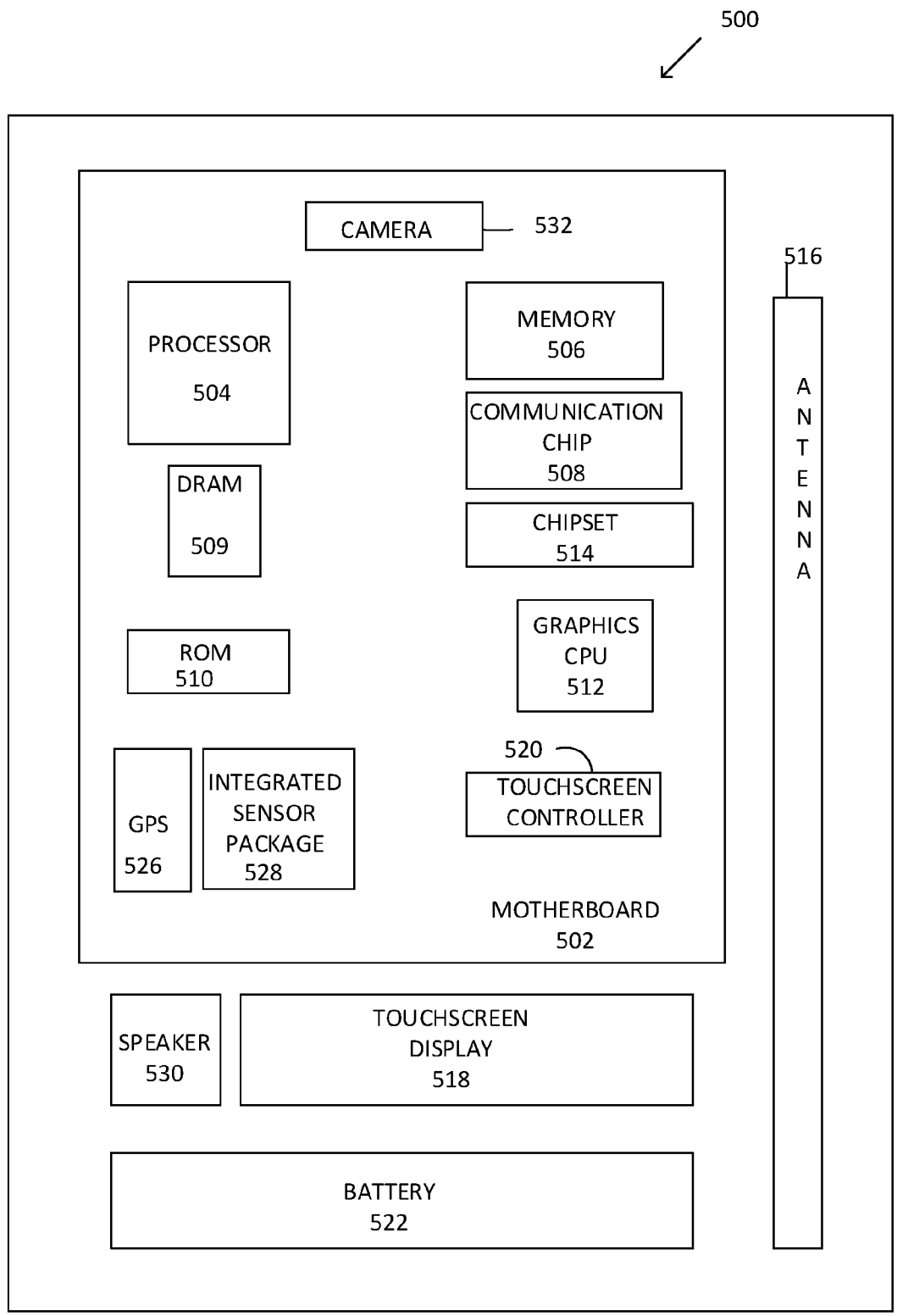
FIG. 5 represents a schematic of a computing device according to embodiments.

FIG. 5 is a schematic of a computing device 500 that may be implemented incorporating embodiments of the package structures described herein. For example, any suitable ones of the components of the computing device 500 may include, or be included in, a stacked die/PoP assembly in accordance with any of the embodiments disclosed herein. In an embodiment, the computing device 500 houses a board 502, such as a motherboard 502 for example. The board 502 may include a number of components, including but not limited to a processor 504, an on-die memory 506, and at least one communication chip 508. The processor 504 may be physically and electrically coupled to the board 502. In some implementations the at least one communication chip 508 may be physically and electrically coupled to the board 502. In further implementations, the communication chip 508 is part of the processor 504.

Depending on its applications, computing device 500 may include other components that may or may not be physically and electrically coupled to the board 502, and may or may not be communicatively coupled to each other. These other components include, but are not limited to, volatile memory (e.g., DRAM) 509, non-volatile memory (e.g., ROM) 510, flash memory (not shown), a graphics processor unit (GPU) 512, a chipset 514, an antenna 516, a display 518 such as a touchscreen display, a touchscreen controller 520, a battery 522, an audio codec (not shown), a video codec (not shown), a global positioning system (GPS) device 526, a speaker 530, a camera 532, compact disk (CD) (not shown), digital versatile disk (DVD) (not shown), and so forth). These components may be connected to the system board 502, mounted to the system board, or combined with any of the other components.

The communication chip 508 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 508 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 508. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a wearable device, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments of the package structures described herein may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

EXAMPLES

Example 1 is a microelectronic package structure comprising a first package module, comprising a first die on a first substrate, at least one circuit element adjacent the first die, a mold material directly disposed on at least a portion of the first die and directly disposed on at least a portion the at least one circuit element; and a second package module comprising: a second die on the first package module.

Example 2 includes the structure of example 1 wherein at least one embedded via extends through the molding compound, and wherein at least a portion of the at least one embedded via is directly on the at least one circuit element.

Example 3 includes the structure of example 1 wherein a routing layer is directly on a top surface of the molding compound, and wherein a top surface of the at least one embedded via is directly on the routing layer.

Example 4 includes the structure of example 1 wherein the at least one circuit element is selected from the group consisting of a resistor, a capacitor and an inductor.

Example 5 includes the structure of example 1 wherein the at least one embedded via is directly on the first substrate.

Example 6 includes the structure of example 1 wherein one of the at least one circuit elements is electrically coupled to only one of the first package module or the second package module.

Example 7 includes the structure of example 1 wherein one of the at least one circuit elements is electrically coupled to both the first package module and the second package module.

Example 8 includes the structure of example 1 wherein the mold compound comprises a heat conductive and an electrically insulating mold compound.

Example 9 is a microelectronic package structure comprising a first package module, comprising: a first die on a first substrate; a circuit element adjacent the first die and disposed on the first substrate; an embedded via disposed directly on at least a portion of the circuit element; a mold compound directly disposed on the first die, wherein the mold compound is further directly disposed on at least a portion the circuit element, and is directly disposed on the embedded via; a conductive routing layer disposed on at least a portion of a top surface of the mold compound, wherein the embedded via is disposed directly on the conductive routing layer; and a second package module comprising: a second die on the first package module.

Example 10 includes the structure of example 9 wherein the conductive routing layer is disposed on substantially the entire top surface of the mold compound.

Example 11 includes the structure of example 9 wherein the embedded via is entirely embedded within the mold compound.

Example 12 includes the structure of example 9 wherein the circuit element is a resistor, a capacitor or an inductor.

Example 13 includes the structure of example 9 wherein the embedded via is electrically coupled to conductive structures disposed in the first substrate.

Example 14 includes the structure of example 9 wherein the first die comprises a microprocessor, and the second die comprises a portion of a wearable device.

Example 15. includes the structure of example 9 wherein the second die comprises an RF die.

Example 16. includes the structure of example 9 wherein the second die is surface activated bonded to the conductive routing layer.

Example 17 is a method of forming a microelectronic package structure, comprising: forming a circuit element on a first substrate, wherein a first die is on the first substrate, and wherein the first die is adjacent the circuit element; forming a via disposed directly on a surface of the circuit element; forming a mold compound on the first die, on the circuit element and on the via, wherein the via is completely embedded in the mold compound; forming a routing layer on a top surface of the mold compound; and attaching a second die on the routing layer.

Example 18 includes the method of example 17 further comprises wherein the circuit element is formed on conductive structures disposed within the first substrate.

Example 19 includes the method of example 17 further comprises wherein the circuit element is not disposed within an interposer.

Example 20 includes the method of example 17 wherein forming the routing layer includes wherein the routing layer is formed directly on a top portion of the via.

Example 21 includes the method of example 17 further comprising wherein forming the mold compound includes completely embedding the via in the mold compound, and completely embedding the circuit element in the mold compound.

Example 22 includes the method of example 17 further comprising wherein forming the mold compound includes forming a heat sink that is electrically isolating.

Example 23 includes the method of example 17 further comprising wherein the routing layer is formed on an entire top surface of the mold compound.

Example 24 includes the method of example 17 further comprising wherein the circuit element comprises one of a resistor, a capacitor or an inductor.

Example 25 includes the method of example 17 wherein the second die comprises a portion of a wearable device.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A microelectronic package structure comprising:
   a first package comprising:
   a first die on a first substrate;
   a first circuit element on the first substrate and adjacent a first side of the first die, wherein a first contact structure is on a sidewall surface of the first circuit element;
   a second circuit element on the first substrate and adjacent a second side, opposite the first side of the die, wherein a second contact structure is on a sidewall surface of the second circuit element;

a mold material over the first die and directly on at least a portion of the top surface of the first circuit element and on at least a portion of the top surface of the second circuit element;

a first embedded via structure directly on a top surface of the first contact structure, and a second embedded via structure directly on a top surface of the second contact structure, wherein the first embedded via structure and the second embedded via structure extend through the mold material, wherein the first and the second embedded via structures comprise a conductive material;

a routing layer, wherein the routing layer comprises a single, continuous conductive layer, directly on a top surface of the first embedded via structure and directly on a top surface of the second embedded via structure, wherein the routing layer extends between the first and second embedded via structures; and a second package over the first package, the second package comprising:

a second die over the first die.

2. The microelectronic package structure of claim 1 wherein the top surfaces of the first embedded via structure and the second embedded via structure are coplanar with a top surface of the mold material, and wherein the first and second embedded via structures extends above a surface of the first die, wherein the surface of the first die is opposite a top surface of the first substrate.

3. The microelectronic package structure of claim 2 wherein the routing layer comprises copper, and extends continuously over the entire surface of the first die.

4. The microelectronic package structure of claim 1 wherein at least one of the first circuit element or the second circuit element comprises one of a resistor, a capacitor or an inductor.

5. The microelectronic package structure of claim 2 wherein a third contact structure is on an opposite sidewall surface of the first circuit element, and a third embedded via structure is on a top surface of the third contact structure, wherein the mold material is between the first embedded via structure and the third embedded via structure.

6. The microelectronic package structure of claim 1 wherein at least one of the first or second circuit elements is electrically coupled to only one of the first package or the second package.

7. The microelectronic package structure of claim 1 wherein at least one of the first or second circuit elements is electrically coupled to both the first package and the second package.

8. The microelectronic package structure of claim 1 wherein the mold material comprises a heat conductive and an electrically insulating mold compound.

9. A microelectronic package structure comprising:

a first package comprising:

a first die on a first substrate;

a first circuit element adjacent a first side of the first die and on the first substrate;

a second circuit element on the first substrate and adjacent a second side, opposite the first side of the die;

a first embedded via structure on at least a portion of a top surface of the first circuit element, wherein the first embedded via structure comprises a conductive material;

a second embedded via structure on at least a portion of a top surface of the second circuit element, wherein the second embedded via structure comprises a conductive material;

a mold material directly on a top surface of the first die, wherein the mold material is further directly on at least a portion of the top surfaces of the first and second circuit elements, and is directly on the first and second embedded via structures;

a routing layer, wherein the routing layer comprises a single, continuous conductive layer, directly on a top surface of the first embedded via structure and directly on a top surface of the second embedded via structure, wherein the routing layer extends between the first and second embedded via structures;

a second package over the first package comprising:

a second die over the first die.

10. The microelectronic package structure of claim 9 wherein the routing layer is on the entire top surface of the mold compound.

11. The microelectronic package structure of claim 9 wherein the first and second embedded via structures are entirely embedded within the mold compound.

12. The microelectronic package structure of claim 9 wherein at least one of the first or the second circuit element is a resistor, a capacitor or an inductor.

13. The microelectronic package structure of claim 9 wherein at least one of the first or the second embedded via structures is electrically coupled to conductive structures in the first substrate.

14. The microelectronic package structure of claim 9 wherein the first die comprises a microprocessor, and the second die comprises a portion of a wearable device.

15. The microelectronic package structure of claim 9 wherein the second die comprises an RF die.

16. The device structure of claim 9, wherein the second die is bonded to the routing layer.

* * * * *